United States Patent [19]

Ratzel

[11] Patent Number: 5,572,130
[45] Date of Patent: Nov. 5, 1996

[54] METHOD AND APPARATUS FOR THE PRODUCTION OF AN NMR TOMOGRAPHY IMAGE USING AN ARRAY OF SURFACE COILS AND MULTIPLEXERS

[75] Inventor: Dieter Ratzel, Rheinstetten, Germany

[73] Assignee: Bruker Medizintechniik GmbH, Rheinstetten, Germany

[21] Appl. No.: 421,045

[22] Filed: Apr. 12, 1995

[30] Foreign Application Priority Data

Apr. 12, 1994 [DE] Germany .................. 44 12 446.5

[51] Int. Cl.⁶ ................................................ G01R 33/28
[52] U.S. Cl. ...................................... 324/318; 324/322
[58] Field of Search .................................. 324/318, 322, 324/314, 300, 314; 128/653.5

[56] References Cited

U.S. PATENT DOCUMENTS

| | | | |
|---|---|---|---|
| 4,733,183 | 3/1988 | Young | 324/318 |
| 4,825,162 | 4/1989 | Roemer et al. | 324/318 |
| 5,084,675 | 1/1992 | Reinfelder et al. | 324/309 |
| 5,122,749 | 6/1992 | Hashino | 324/322 |
| 5,144,243 | 9/1992 | Nakabayashi et al. | 324/318 |
| 5,243,288 | 9/1993 | Mori | 324/322 |
| 5,272,437 | 12/1993 | Wardenier | 324/322 |

FOREIGN PATENT DOCUMENTS

| | | | |
|---|---|---|---|
| 0412824 | 2/1991 | European Pat. Off. | G01R 33/54 |
| 0460761 | 12/1991 | European Pat. Off. | G01R 33/30 |
| 0472390 | 2/1992 | European Pat. Off. | G01R 33/54 |
| 0487201 | 5/1992 | European Pat. Off. | G01R 33/36 |
| 4037294 | 7/1991 | Germany | G01R 33/36 |

Primary Examiner—Sandra L. O'Shea
Assistant Examiner—Raymond Y. Mah

[57] ABSTRACT

In a method and apparatus for the production of a nuclear magnetic resonance (NMR) tomography image with radio frequency (RF) signals from an extended measuring object (11) being detected by n surface coils (2a, 2b, 2c, 2d) of an NMR apparatus, whereby n>1, and the n RF signals are separately preamplified by n preamplifiers (3a, 3b, 3c, 3d) each assigned to one of the n surface coils (2a, 2b, 2c, 2d), and subsequently further amplified and detected in a phase sensitive fashion, as a result of which a low frequency signal is obtained in each case which is introduced to one of n low pass filters (5a, 5b, 5c, 5d) of an analog/digital converter (ADC) and whereby n partial images are produced in a computer (8) from the n signals obtained in this fashion and assembled into a single NMR tomography image of the measuring object (11) in a region of interest, the signals emanating from the n low pass filters (5a, 5b, 5c, 5d) are introduced to a single ADC (7) via a first multiplexing circuit (6) to be digitized and passed on to the computer (8). In this fashion is it possible for n-1 high speed ADC'S as well as a complicated interface for the input of the signals from the different measuring chains into the computer to be dispensed with and the utility of an already existing NMR apparatus can be significantly increased.

4 Claims, 4 Drawing Sheets

METHOD AND APPARATUS FOR THE PRODUCTION OF AN NMR TOMOGRAPHY IMAGE USING AN ARRAY OF SURFACE COILS AND MULTIPLEXERS

BACKGROUND OF THE INVENTION

The invention concerns a method for the production of a nuclear magnetic resonance (NMR) tomography image with radio frequency (RF) signals from an extended measuring object being detected by n surface coils of an NMR apparatus, whereby n>1, and the n RF signals are separately preamplified by n preamplifiers each assigned to one of the n surface coils, and subsequently further amplified and detected in a phase sensitive fashion, as a result of which a low frequency signal is obtained in each case which is introduced to one of n low pass filters of an analog/digital converter (ADC) and whereby n partial images are produced in a computer from the n signals obtained in this fashion and assembled into a single NMR tomography image of the measuring object in a region of interest.

A method of this type is known in the art, for example, from EP 0 472 390 A2.

With NMR tomography high field magnets, having increasing magnetic field strengths, it is an ever increasing problem to construct functioning surface coils with sufficient FOV (field of view). This is the case for medical applications in particular with spatially extended organs, such as the human spine. The reason for this is that this type of large area coil does not have good radio frequency properties, e.g. the signal-to-noise ratio is relatively poor.

A recently practised solution therefor utilizes a "coil array" with a plurality of n partial coils which independently, e.g. mutually decoupled, receive signals from the FOV which are separately handled in n individual channel chains and processed via individual ADC's into partial images instead of utilizing one single large coil with one single signal processing chain.

The advantage of the n-chain solution over the classical 1-chain configuration is that each of the n partial coils exhibits a substantially larger Q-factor due to their resulting smaller dimensions.

This type of n-chain configuration is, for example, described in the patent manuscripts U.S. Pat. No. 4,871,969 or U.S. Pat. No. 5,144,243.

A substantial disadvantage in the configuration known in the art consists in the immense hardware costs and problems, since in addition to the devices for RF amplification, demodulation and filtering, a plurality of expensive high speed ADC's must also be available. Moreover, a special extremely costly and/or difficult interface is necessary to introduce the n signals from the different partial coils into the input of an available standard computer which normally accommodates a conventional 1-chain configuration. In order to be able to transfer the acquired data at all in a reasonable fashion into the computer a structure, which is not initially available, must be created. For these reasons, it is nearly impossible to retroactively reconfigure a tomography system into a multiple chain system for cost and space reasons.

It is therefore the purpose of the present invention to present a method of the above mentioned kind which, despite the utilization of an n-chain configuration, is sufficiently simplified that an easy adaptation to available data processing systems for NMR tomographs is possible, whereby, in comparison to the classical 1-chain configuration, the additional n–1 high speed ADC's which are normally necessary in a multiple chain configuration can be dispensed with.

SUMMARY OF THE INVENTION

This purpose is achieved in accordance with the present invention in a manner which is as surprisingly simple as it is effective in that the signals emanating from the n low pass filters are introduced to a single ADC via a first multiplexing circuit to be digitized and passed on to the computer.

In the methods known in the art from EP 0 472 390 A2, U.S. Pat. No. 4,871,969 and U.S. Pat. No. 5,144,243 for the production of NMR tomography images with the assistance of a plurality of simultaneously driven coils (array) each coil requires, in contrast to the method in accordance with the invention, an individual high speed ADC for the signal chain to the computer which, on the one hand, leads to the above described high costs of such a system and, on the other hand, to compatibility problems when passing the signals on to a standard computer designed for classical 1-chain systems. With a multiplexing of the signal input to one individual ADC, it is possible, with the solution in accordance with the invention, to avoid these problems without great technical difficulties. In addition, by dispensing with the plurality of additional high speed ADC's, the operational reliability is increased, since with a single apparatus less problems or failures occur than with a plurality of equivalent devices.

An embodiment of the method in accordance with the invention is particularly preferred with which the n preamplified signals are introduced to one single phase sensitive detector via a second multiplexing circuit and fed to the correspondingly assigned low pass filter via a third multiplexing circuit, whereby the three multiplexing circuits are coupled to each other.

In this fashion, in addition, n–1 phase sensitive detectors, which are likewise usually extremely expensive, can also be dispensed with, which contributes to additional significant cost advantages for the method in accordance with the invention compared to the conventional solution. In addition, due to the reduction of n additional complex individual devices into a single one, the operational reliability and ease of maintenance of the system in accordance with the invention are improved.

In a further variation of the method in accordance with the invention, the n partial images produced from the n signals introduced to the computer are each set to zero in the corresponding image regions where the corresponding surface coils deliver insignificant signal amounts from the measuring object, preferentially for a reduction of signal intensity to less than 70% of the value in the central region. In this fashion the additional noise produced by the n-chain configuration in the n receiving channels compared to the 1-chain configuration does not contribute to the total image noise, since only those surface coil signal portions are utilized which contribute to the image region of the corresponding coil which, in turn, is reduced relative to the entire field of view (FOV). In other words one produces, altogether, n individual images each with 1/n of the required FOV.

This method is advantageous when the received RF signals are filtered both in the direction of the read gradient as well as in the direction of the phase encoding gradients of the NMR apparatus. With the method known in the art, for example, through the above mentioned EP 0 472 390 A2 (see FIG. 5 thereof) this is not possible; here it is only possible to filter in the read direction as a result of which the resulting total image noise can be significantly increased compared to that in the method in accordance with the invention.

In embodiments of the method in accordance with the invention 2 DFT-reconstruction algorithms for image reconstruction can be utilized or also, for example, 3-dimensional reconstruction methods.

An apparatus for the processing of radio frequency (RF) signals from an extended measuring object in a nuclear spin resonance (NMR) tomography device with an array of n surface coils is also within the framework of the present invention, each coil being connected to a signal input of one of n preamplifiers, whereby n>1 and the signal output of each preamplifier is connected to the signal input of a phase sensitive detector, whereby the signal output of the phase sensitive detector is connected to the input of one of n low pass filters, whereby the output of each low pass filter is connected to an input of an analog/digital converter (ADC) and whereby the output of the ADC is connected to the input of the computer.

The device in accordance with the invention distinguishes itself from the conventional devices known in the art from, for example, the above mentioned publications in that only one single ADC is provided connected to outputs of the n low pass filters via a first multiplexing circuit.

An embodiment of the device in accordance to the invention is particularly preferred in which only one single phase sensitive detector is provided for whose signal input is connected via second multiplexing circuit to the signal outputs of the n preamplifiers and whose signal output is connected via a third multiplexing circuit to the inputs of the n low pass filters, whereby the first, second and third multiplexing circuits are coupled to each other.

The invention is more closely described and explained below in connection with the embodiments and the drawing. The features which can be extracted from the description can be used in other embodiments of the invention individually or collectively in arbitrary combination.

DESCRIPTION OF THE PREFERRED EMBODIMENT

Figure 3:
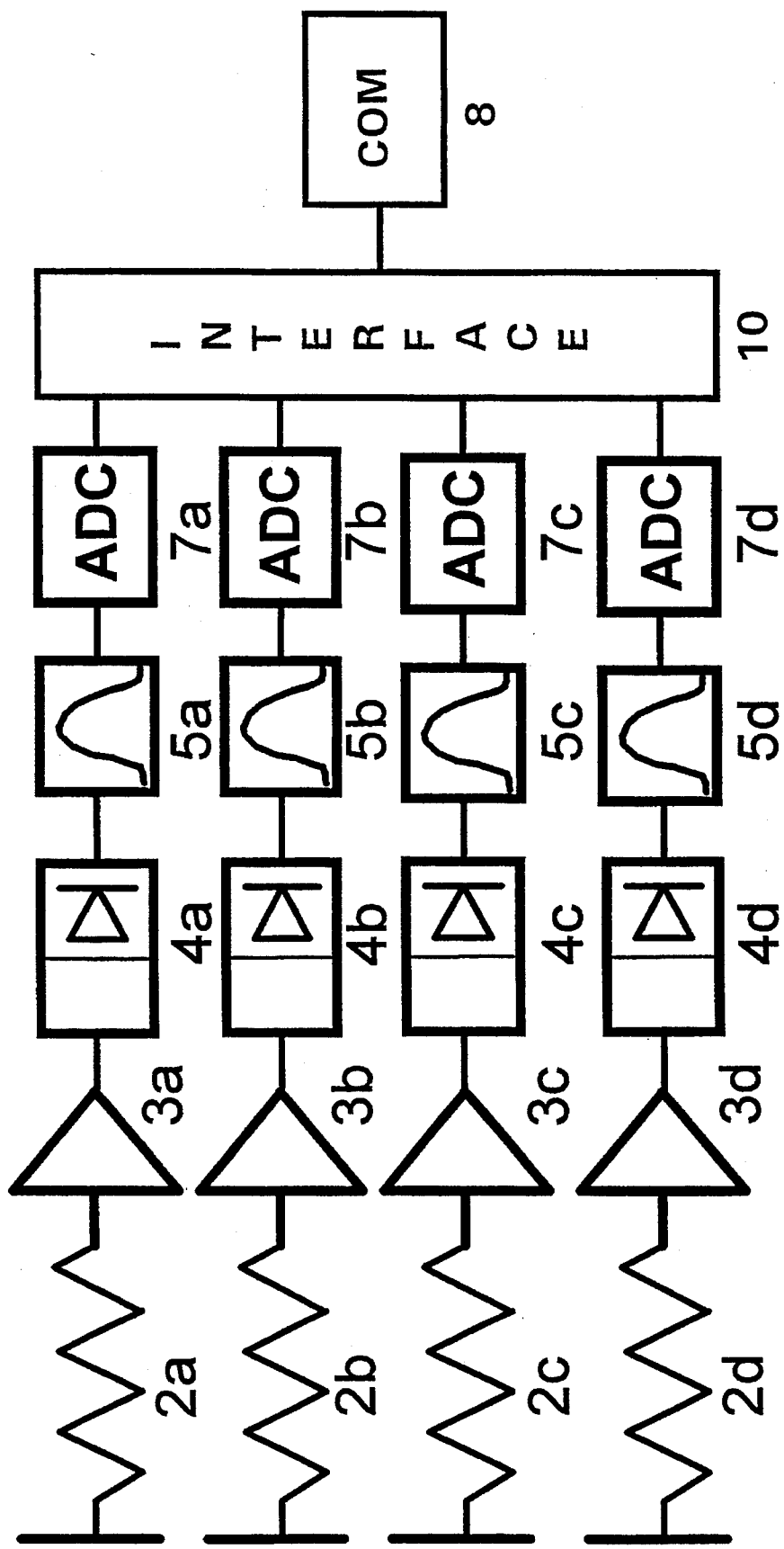
FIG. 3 shows a schematic circuit diagram of a device according to prior art.

The four measuring chains of a nuclear magnetic resonance (NMR) tomography device with an array of four surface coils 2a–2d with which radio frequency (RF) signals from each of a partial region of an extended measuring object can be received are schematically represented in FIG. 3. Each of the four measuring chains shown in this conventional device consists of the corresponding surface coil 2a–2d, a preamplifier 3a–3d connected to the corresponding coil with which the signals from the coil are separately highly amplified to a lever at which they can easily be transferred over long cable lengths and, in each case, a downstream phase sensitive detector 4a–4d at the output of which a low frequency signal is introduced, via a low pass filter 5a–5d, to one ADC 7a–7d, in each case.

In the classical 1-chain solution utilizing only one single NMR apparatus surface coil, the digitized signal emerging from the ADC is directly passed to a corresponding input of a computer 8 where it is processed into a tomography image of the object region recorded usually after carrying out a Fourier transformation. In the configuration shown in FIG. 3 a relatively complex interface 10 is, however, normally necessary in order to join different digitized partial signals from the fast ADC converters 7a–7d together and to pass them on, in a suitable form, to the computer 8.

The advantage of such a multiple chain configuration is that, due to the smaller dimensions of the corresponding partial coils 2a–2d, a substantially higher Q-factor can be achieved compared to the 1-chain configuration with the correspondingly larger RF coil. The price for the higher Q-factor in the conventional configuration shown in FIG. 3 is, however, an enormously increased hardware expense since, in addition to RF amplification, demodulation and filtering a plurality of high speed ADC's must also be available. In addition, an interface 10 structure which is not initially present in the conventional devices must be created in order to reasonably pass the plurality of partial image data to the computer 8. For this reason a reconfiguration of a classical 1-chain system into a multiple chain system is nearly impossible or uneconomical in an existing NMR tomograph for cost and space reasons.

Figure 1:
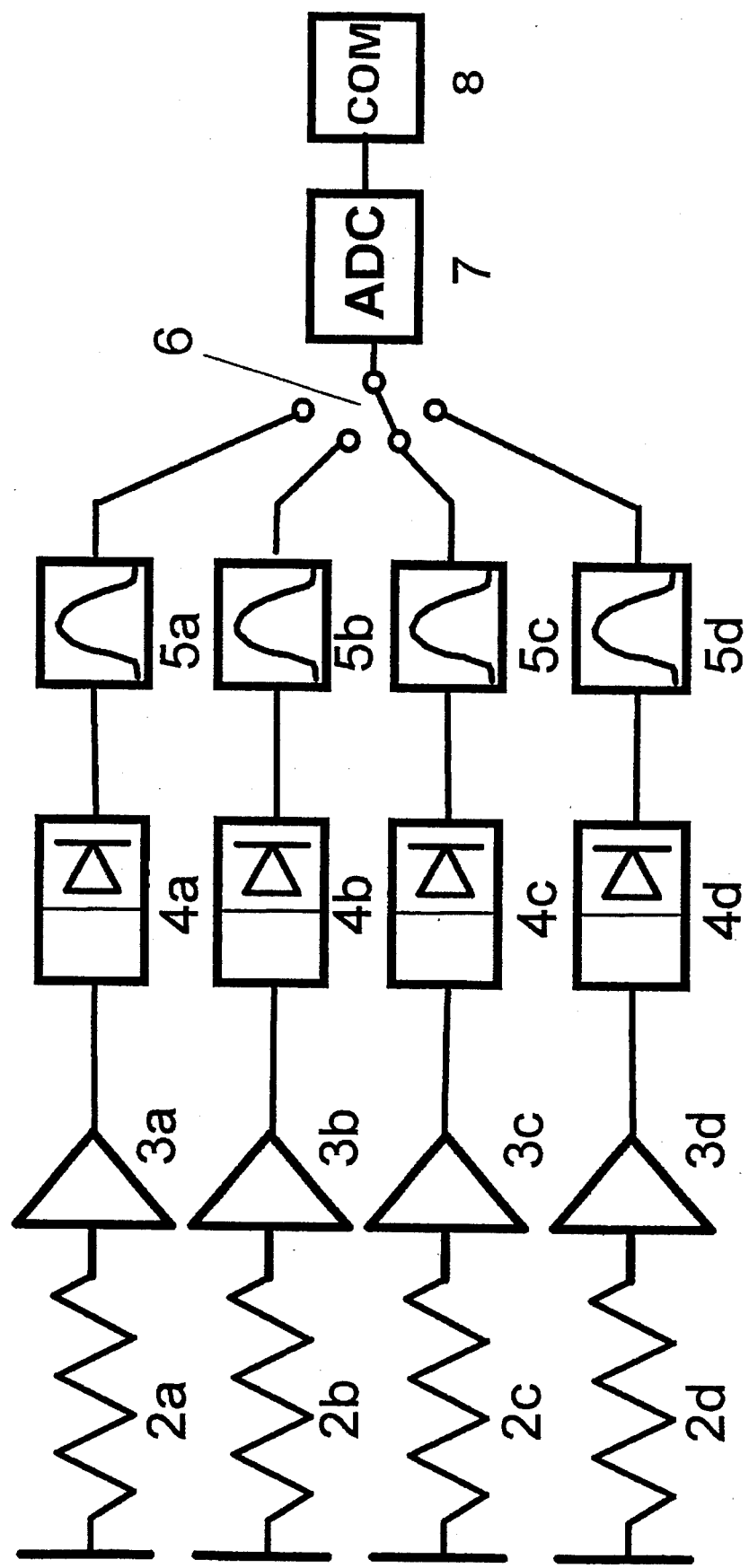
FIG. 1 shows a schematic circuit diagram of an embodiment of the device in accordance with the invention with one single ADC.
Figure 2:
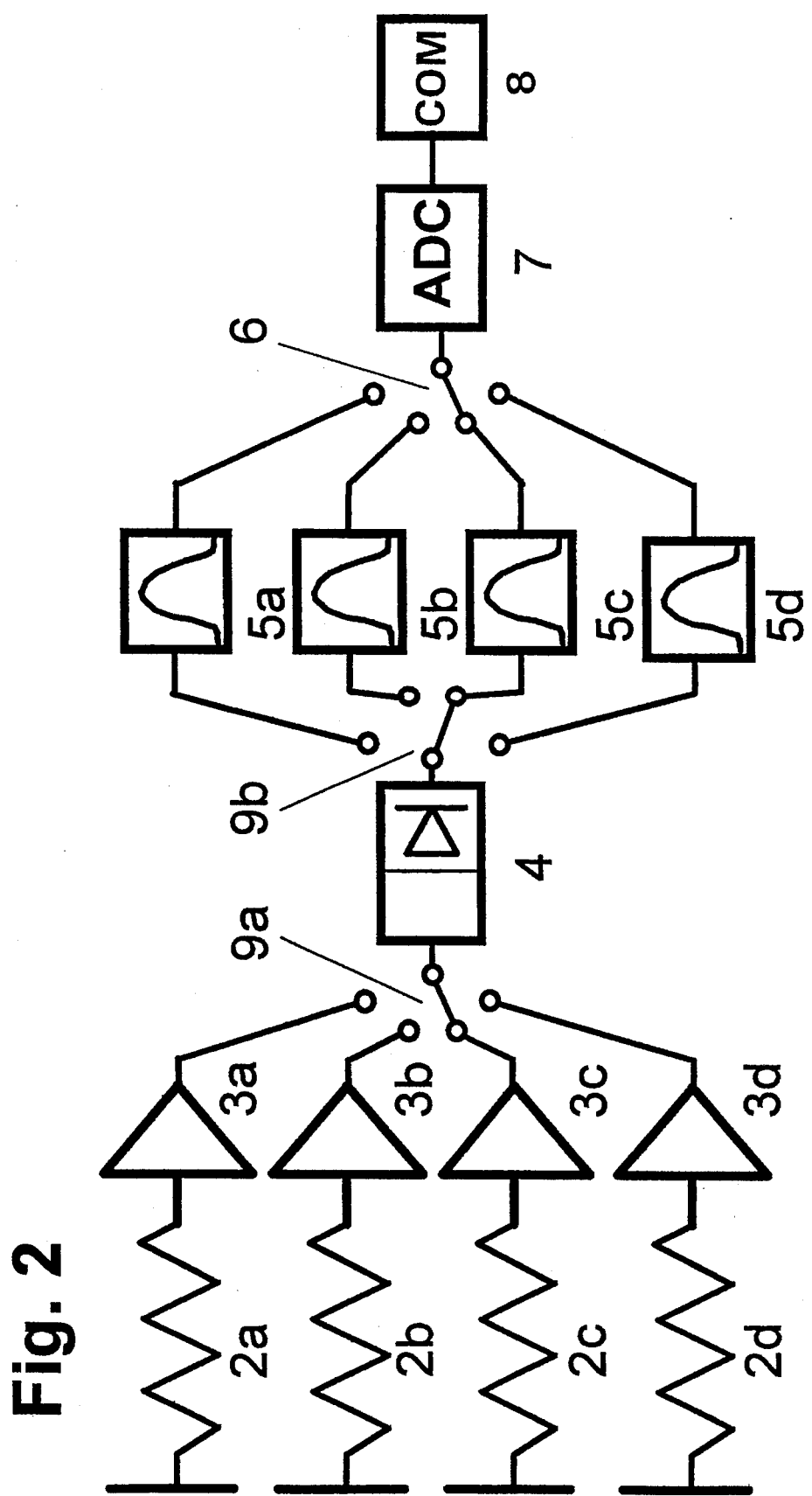
FIG. 2 shows a schematic circuit diagram of a further embodiment having one single phase sensitive detector.

An extremely simple and economical solution is thereby provided by the configuration in accordance with the present invention as schematically represented in FIGS. 1 and 2. In the configuration shown in FIG. 1, the signals are passed from the low pass filters 5a–5d via a first multiplexing circuit 6 to one single high speed ADC 7 which feeds a sole signal input of the computer 8 as was the case in the classical 1-chain configuration. In this fashion it is easy to retroactively reconfigure, with appropriate software support in the computer 8, a previously installed 1-chain NMR tomography system into a multiple chain array configuration to significantly increase the utility of existing devices whereby, in addition, the dispensing with expensive n−1 ADC's compared to the conventional n-chain system is an advantageous side-effect.

In the embodiment shown in FIG. 2 of the apparatus in accordance with the invention, the additional n−1 likewise relatively expensive phase sensitive detectors 4a–4c are also dispensed with by introducing the individual signals coming out of the n preamplifiers 3a–3b, via a second multiplexing circuit 9a to the input of one single phase sensitive detector 4 with the processed signals at its output being passed, via a third multiplexing circuit 9b, to the inputs of the n low pass filters 5a–5d. The first, second and third multiplexing circuits 6, 9a, 9b are connected to each other in order to properly sequentially pass the corresponding partial signals from one of the surface coils 2a–2b to the correspondingly assigned low pass filter 5a–5d and in order to be able to identify the corresponding partial coil in the computer 8 based on the time of arrival of the corresponding signal input.

A sample and hold circuit is provided for at the input of each low pass filter 5a–5b as well as at the input of the common ADC in order to hold the partial signal coming from a partial coil at the last signal height received in each case until the next switching connection to the corresponding chain through the corresponding multiplexer, during which time signal transfer is switched to the other partial chains.

In order to obtain partial images which exhibit the same parameters as the classic 1-chain technique, whereby in particular the "dwell time", e.g. the time separation between two measuring points for each individual image, is kept constant, it is necessary for the multiplexer 6, 9a, 9b to be switched at 1/n of the dwell time. Therefore, in the same amount of time, n partial image data sets are sequentially transferred to the computer 8 where the corresponding data are separated out in a simple fashion and processed into partial images. A frequently used dwell time is, for example, 20 microseconds corresponding to a frequency width of 25 kHz. The multiplexers are switched between the different partial chains, for example, in a 4-chain configuration, with a repetition frequency of 4×2×25 kHz=200 kHz.

Figure 4A:
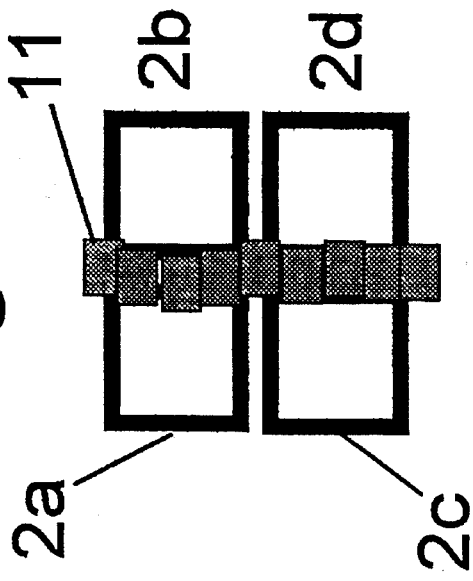
FIG. 4a shows a schematic representation of a 4-coil array relative to a coronary measured and schematically represented spine.
Figure 4B:
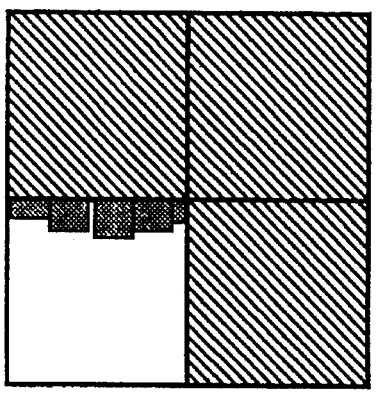
FIG. 4b shows a schematic partial image from a first of four surface coils.
Figure 4C:
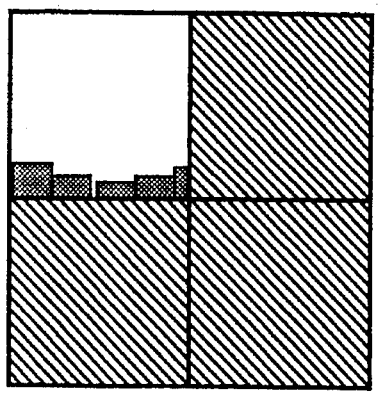
FIG. 4c shows a schematic partial image from a second of four surface coils.
Figure 4D:
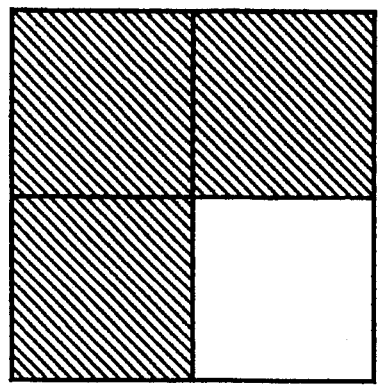
FIG. 4d shows a schematic partial image from a third of four surface coils.
Figure 4E:
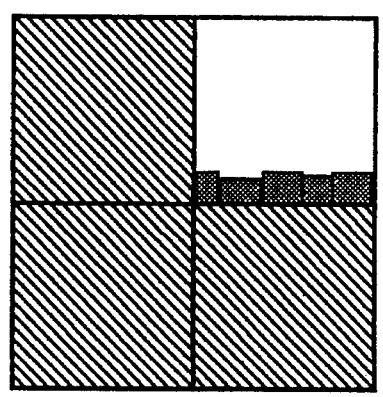
FIG. 4e shows a schematic partial image from a fourth of four surface coils.
Figure 4F:
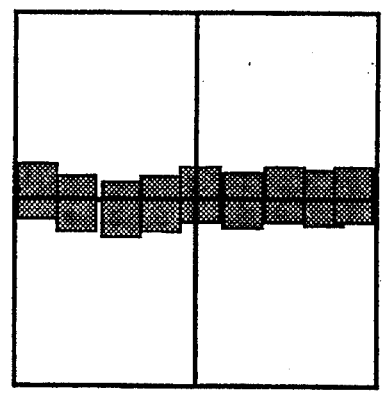
FIG. 4f shows a schematic composite image of the spine produced from the partial images of FIGS. 4b–e.

FIG. 4a schematically shows an extended measuring object 11, for example a human spine, in a coronary measuring configuration with a 4-coil array comprising four schematically represented surface coils 2a–2d. Each of the FIGS. 4b–4e shows the corresponding partial images which is recorded with the assistance of the surface coils 2a–2d in a configuration in accordance with the invention, whereby each corresponding image region of the partial images is set to zero in the computer 8 (cross-hatched region in the FIGS. 4b–4e), when the corresponding surface coil 2a–2d does not contribute a significant signal from the measuring object 11. A reduction of the intensity due to the limited range of the corresponding individual coils to, for example, less than 70% can be utilized as a criterion for the zeroing of the partial images. In this manner, additional noise is avoided compared to a 1-chain solution. The correspondingly weighted partial images are subsequently added together in the computer 8 to one total image as schematically represented in FIG. 4f.

In a 2-dimensional case, a 2 DFT-reconstruction algorithm can be utilized for image reconstruction. Analogously, the production of a 3-D-tomogram is also possible in which the slice gradient is replaced by an additional phase encoding gradient.

I claim:

1. Method for the generation of a nuclear magnetic resonance (NMR) image of an object using n>1 surface coils comprising the steps of:

a) extracting one signal from each surface coil to produce n signals from the object;

b) preamplifying each signal in a separate preamplifier to produce n preamplified signals;

b1) multiplexing the n preamplified signals in a first multiplexer to produce n multiplexed preamplified signals;

b2) feeding the n multiplexed preamplified signals into a phase sensitive detector;

c) detecting the n preamplified signals in the phase sensitive detector to produce n low frequency signals;

c1) multiplexing the n low frequency signals in a second multiplexer to produce n multiplexed low frequency signals;

c2) feeding the n multiplexed low frequency signals into separate filters;

d) filtering the low frequency signals in the separate filters to produce n filtered signals;

e) multiplexing the n filtered signals in a third multiplexer to produce n multiplexed filtered signals;

f) digitizing the n multiplexed filtered signals in an analog to digital converter (ADC) to produce n digitized signals;

g) imaging the n digitized signals in a computer to produce n partial images of the object; and h) assembling the n partial images into a single image of the object.

2. Apparatus for the generation of a nuclear magnetic resonance image of an object comprising:

n>1 surface coils for generating n signals from the object;

n preamplifiers connected to the surface coils for preamplifying one each of the n signals to produce n preamplified signals;

a first multiplexer connected to the n preamplifiers;

a phase sensitive detection means connected to the first multiplexer for producing n low frequency signals;

a second multiplexer connected to the phase sensitive detection means;

n filters connected to the second multiplexer for filtering one each of the n low frequency signals to produce n filtered signals;

a third multiplexer connected to the n filters to produce n multiplexed filtered signals;

an ADC connected to the third multiplexer for digitizing the n multiplexed filtered signals to produce n digitized signals;

a computer connected to the ADC for processing the n digitized into n partial images and for processing the n partial images into one single image of the object; and multiplexer connection means connected to the first, second and third multiplexers.

3. The method of claim 1, further comprising the step of:

g1) zeroing partial images from signals having a signal strength less than a signal strength threshold.

4. The method of claim 1, further comprising the step of:

g2) reconstructing an image of the object using a two dimensional Fourier transformation algorithm.

* * * * *